(12) United States Patent
Okayama (10) Patent No.: US 6,677,881 B1
(45) Date of Patent: Jan. 13, 2004

(54) RADIO WAVE ABSORBER

(75) Inventor: Katsumi Okayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/642,740

(22) Filed: Aug. 18, 2000

(30) Foreign Application Priority Data

Aug. 19, 1999 (JP) ............................................ 11-232786

(51) Int. Cl.$^7$ ................................................ H01Q 17/00
(52) U.S. Cl. ................................................. 342/4; 342/1
(58) Field of Search ................................. 342/1, 2, 3, 4

(56) References Cited

U.S. PATENT DOCUMENTS

| | | | | |
|---|---|---|---|---|
| 5,093,100 A | * | 3/1992 | Sadamura et al. | 342/1 |
| 5,148,172 A | * | 9/1992 | Kumurdjian | 342/1 |
| 5,179,381 A | * | 1/1993 | Hatakeyama | 342/1 |
| 5,298,903 A | * | 3/1994 | Janos | 342/1 |
| 5,310,598 A | * | 5/1994 | Yoshinaka et al. | 428/328 |
| 5,668,070 A | * | 9/1997 | Hong et al. | 501/126 |
| 6,031,509 A | * | 2/2000 | Kaitani | 343/912 |

* cited by examiner

*Primary Examiner*—Theodore M. Blum
(74) *Attorney, Agent, or Firm*—Sonnenschein, Nath & Rosenthal LLP (57) ABSTRACT

A magnetic material exhibiting a high permeability at a high frequency range is materialized and a radio wave absorber exhibiting an excellent radio wave absorbing property by using such magnetic material is provided. The radio wave absorber comprises a mixed material containing a magnetic material grain, a resin material and a ceramic material or a low-melting-point metal material, in which the magnetic material grain is made into a disc shape is provided.

21 Claims, 8 Drawing Sheets

MASK REMOVAL

MIXING WITH RESIN OR CERAMICS

A: CONVENTIONAL EXAMPLE
B: PRESENT INVENTION

FIG. 8

RADIO WAVE ABSORBER

RELATED APPLICATION DATA

The present application claims priority to Japanese Application No. P11-232786 filed Aug. 19, 1999, which application is incorporated herein by reference to the extent permitted by law.

BACKGROUND OF THE INVENTION

1. Field of the Invention

The present invention relates to a radio wave absorber, and in particular to a radio wave absorber comprising a mixed material having a magnetic material grain and a resin material or a ceramic material.

2. Description of Related Art

Radio wave absorbers have been used for electric devices, communication apparatuses or the like in order to stabilize functions thereof by absorbing radio waves coming in externally as a disturbance or emitted internally as a leakage. An example of a radio wave absorber already put into practical use is a composite material of grain and resin, where the grain is a spinel ferrite sintered compact, hexagonal ferrite sintered compact or flaky metal soft magnetic material. Conventional radio wave absorbers can absorb radio waves having a frequency of several MHz to several GHz band.

Material parameters expressing characteristics of such a radio wave absorber are complex permittivity $\epsilon$ and complex permeability $\mu$ in a high frequency range. As for a radio wave absorber using a magnetic material, $\mu''$ as an imaginery component of complex permeability $\mu$ ($=\mu'-j\mu''$) relates to the radio wave absorbing characteristics.

Figure 8:
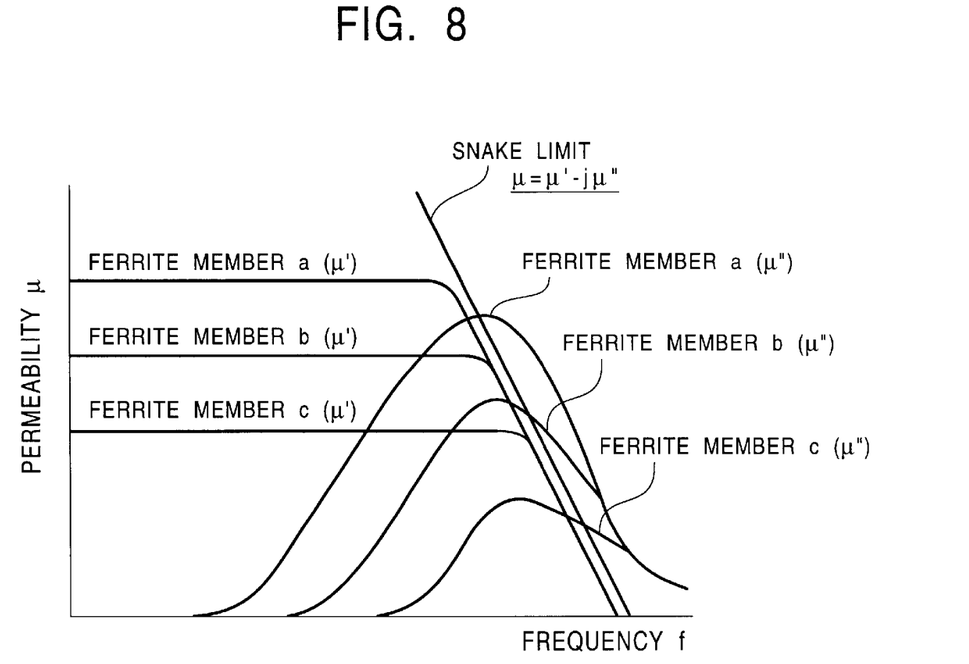
FIG. 8 is a graph showing frequency characteristics of conventional ferrite materials.

FIG. 8 shows complex permeability $\mu$ ($=\mu'-j\mu''$) of spinel ferrites. In the figure, the real component $\mu'$ and imaginery component $\mu''$ are shown for each of three types of ferrites "a" to "c". As is clear from the figure, the real component $\mu'$ descends in a frequency range higher than a certain value and the imaginery component $\mu''$ reaches a maximum value at a resonant frequency $f_r$ which is slightly higher than the above certain value. Higher $\mu''$ corresponds with better absorption due to larger energy loss.

Spinal ferrite with a higher permeability, however, tends to resonate at a lower frequency, and this has prevented the material from being used at a high frequency such as in a GHz range (snake limit). This is expressed by the equation (1) below, which indicates that a product of resonant frequency and permeability is contant:

$$f_r(\mu' - 1) = \frac{\gamma}{3\pi\mu_0} I_s \tag{1}$$

where, $f_r$ is the resonant frequency, $\mu'$ is the real part of the permeability, r is the gyro-magnetic constant, $\mu_0$ is the permeability of vacuum and $I_s$ is the saturation magnetization.

To solve the problem of spinel ferrite exhibiting only a low level of absorption in the high frequency range, Y-type and z-type ferrites have been put into practical use, where the crystal structures of the ferrites belong to the hexagonal system and exhibit in-plane magnetic anisotropy. The use of such ferrites is based on the hexagonal ferrite having a high permeability due to a small in-plane magnetic anisotropy and requiring a larger anisotropic energy to orient the direction of magnetization toward the direction normal to the major plane, so that such ferrite can resonate at a higher frequency range than the spinel ferrite can.

Figure 1:
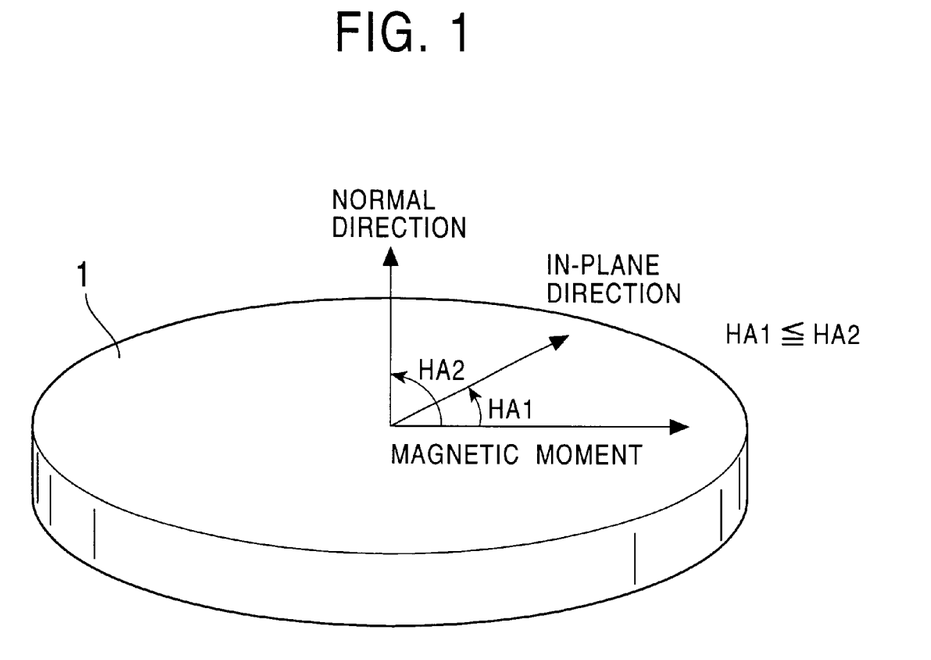
FIG. 1 is a schematic view showing one embodiment [a shape and operation principle] of a disc-shaped magnetic material grain according to the present invention.

However, the resonance level has been limited to several GHz even with such a hexagonal ferrite. The product of the resonant frequency $f_r$ and the permeability $\mu'$ in this case is expressed by the equation (2) below:

$$f_r(\mu' - 1) = \frac{\gamma \cdot I_s}{3\pi\mu_0} \sqrt{\frac{H_{A2}}{H_{A1}}} \tag{2}$$

where, $H_{A1}$ is the in-plane anisotropy an $H_{A2}$ is the anisotropy from the in-plane to "c" axis direction (see FIG. 1).

It is now noticed by comparing the equations (1) and (2), that the equation (2) additionally has a square-root term. The hexagonal ferrite generally has a value of 1 or above for the square-root term as shown by the relation below:

$$\sqrt{\frac{H_{A2}}{H_{A1}}} \geq 1 \tag{3}$$

This is why the hexagonal ferrite can retain a higher permeability in a higher frequency range. The available frequency range of the hexagonal ferrite is, however, limited by its saturation magnetization of about 0.5 T, and a material available at a frequency range of several GHz or above is still unknown. Accordingly the available frequency range of the radio wave absorber has also been limited to several GHz.

SUMMARY OF THE INVENTION

Considering the foregoing situation, it is therefore an object of the present invention to provide a magnetic material exhibiting a high permeability at a high frequency range and to provide a radio wave absorber exhibiting an excellent radio wave absorbing property by using such a magnetic material.

To achieve the foregoing object, the present invention provides a radio wave absorber comprising a mixed material having a magnetic material grain, and one of either a resin material or a ceramic material, wherein said magnetic material grain is in the shape of a disc.

As a result of the disc-shaped magnetic material grain, the frequency limit can be raised up to a level of several GHz or above, and thus a radio wave absorber exhibiting a high permeability at a high frequency range can be obtained.

Conventional magnetic material grains were obtained by pulverizing magnetic material by proper means and had irregular shapes, so that the snake limit could not be overcome. As means for overcoming such a limit, Y-type and Z-type ferrites are commercialized by Royal Philips Electronics. These ferrites have in-plane magnetic anisotropy unlike the spinel ferrite.

To obtain a higher permeability at a higher frequency range than the Y-type and Z-type ferrite material can, raising the saturation magnetization $I_s$ will be successful, which is obvious from the equation (2) above. The ferrite generally has a saturation magnetization of 0.3 T to 0.5 T. In contrast, a metal magnetic material, more specifically, pure iron has such a value of 2.2 T, iron-cobalt alloy (Permendule) 2.4 T, and iron nitrides compound 2.8 T. It is thus understood that developing a metal magnetic material having in-plane magnetic anisotropy will successfully overcome the snake limit and ensure the operation at a higher frequency range than Y-type or Z-type oxide magnetic material having in-plane magnetic anisotropy can.

However, a metal soft magnetic material having in-plane magnetic anisotropy has, not been found. In the present invention, a disc-shaped metal magnetic material was prepared so as to attain a magnetic anisotropy within the in-plane direction, and thus a high permeability at a high frequency range was achieved while retaining a high saturation magnetization. By virtue of such a high permeability, the present invention is successful in obtaining a radio wave absorber having a more advanced absorption property than the conventional one.

According to the present invention, the frequency limit of the magnetic material was successfully raised as high as several GHz or above by fabricating the grain thereof in a disc shape, so that a radio wave absorber exhibiting a high permeability at a high frequency range can be obtained. This allows a radio wave absorber to operate at as high as 10 GHz or above, which has previously been available only in a frequency range as high as 2 to 3 GHz, and to prevent radio wave failure over a wide frequency range. The high permeability achieved herein also allows a reduction in thickness of the radio wave absorber, so that a small-sized and compact radio wave absorber can be fabricated.

DESCRIPTION OF THE PREFERRED EMBODIMENTS

FIG. 1 shows one embodiment of a magnetic material grain made of a metal magnetic material. In the present invention, a flat and disc-shaped magnetic material grain 1 as shown in FIG. 1 may be used. The aspect ratio (ratio of the diameter and thickness) of the disc-shaped magnetic material grain 1 is, preferably, 10 or above.

In the magnetic material, a magnetic moment generally orients so as to minimize the energy. In a magnetic material having a three-dimensional structure, the moment can orient toward individual directions of x, y and z. In contrast, in the disc-shaped metal magnetic material as shown in FIG. 1, the magnetic moment cannot easily orient toward the direction normal to the major plane since such orientation requires an increase in the shape-dependent magnetic anisotropic energy. Therefore, an in-plane orientation of the moment prevails. The in-plane anisotropic energy is referred to as $H_{A1}$, and the anisotropic energy required for raising the magnetic moment from the in-plane direction to the direction normal to the major plane is referred to as $H_{A2}$.

In this case, the in-plane magnetic moment can isotropically orient toward any direction and is ready to move since the magnetic material grain has a disc shape. Threfore, $H_{A1}$, representing the in-plane magnetic anisotropy, is relatively small. In contrast, $H_{A2}$ has a large value since a large energy is required for orientating the magnetic moment toward the direction normal to the major plane. This makes a value for the square-root term in the equation (3) larger, so that the frequency limit is extended to a high frequency range.

Figure 2:
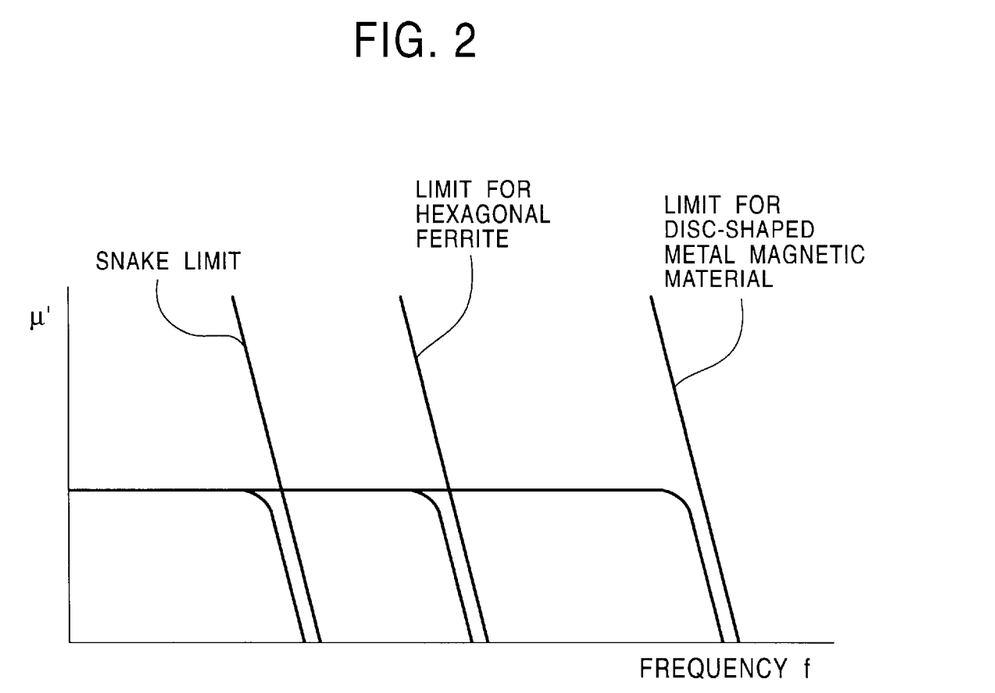
FIG. 2 is a graph showing frequency limits of magnetic materials.

FIG. 2 shows the frequency limits of a spinel ferrite (snake limit), Y-type and z-type ferrites (hexagonal ferrite) and the disc-shaped metal magnetic material grain for use in the present invention. As shown in the figure, using the disc-shaped metal magnetic material grain puts the frequency limit in a high frequency range as compared with the hexagonal ferrite.

Figure 3:
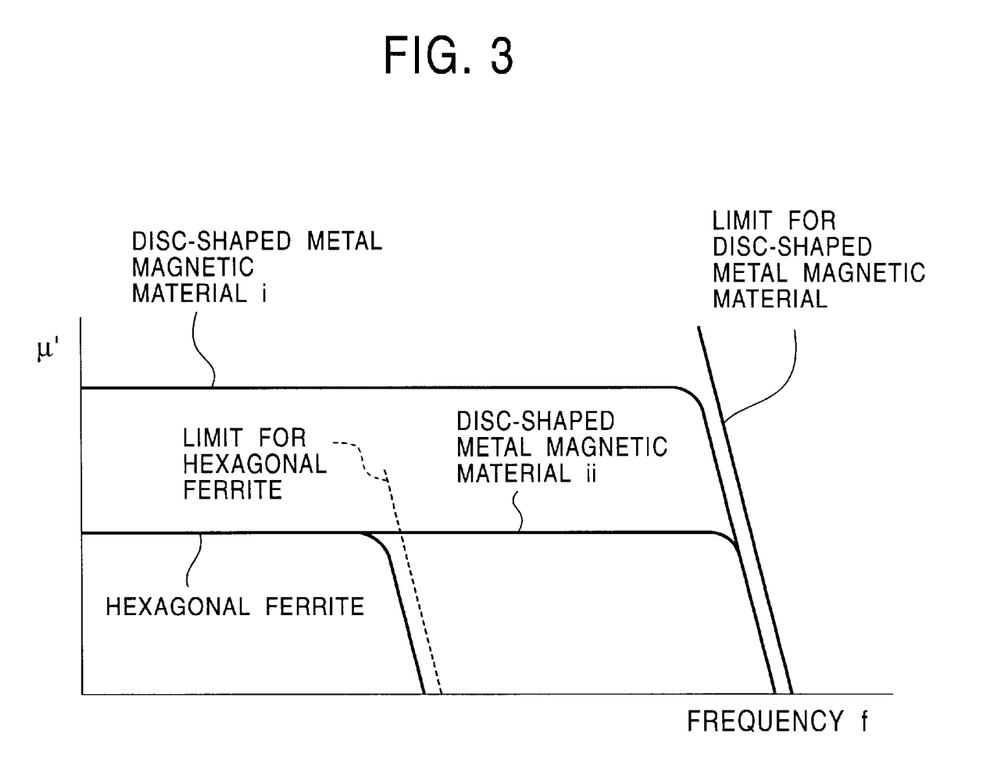
FIG. 3 is a graph showing a frequency limit of the disc-shaped magnetic material grain of the present invention.

It is possible to alter the permeability characteristics by selecting the aspect ratio or thickness of the disc-shaped grain or by changing the mixing composition, which is typically shown by disc-shaped metal magnetic material grains "i" and "ii" in FIG. 3. It is clear that both grains have frequency limits in a higher frequency range as compared with the conventional hexagonal ferrite, and retain a high permeability up to a high frequency.

Figure 4:
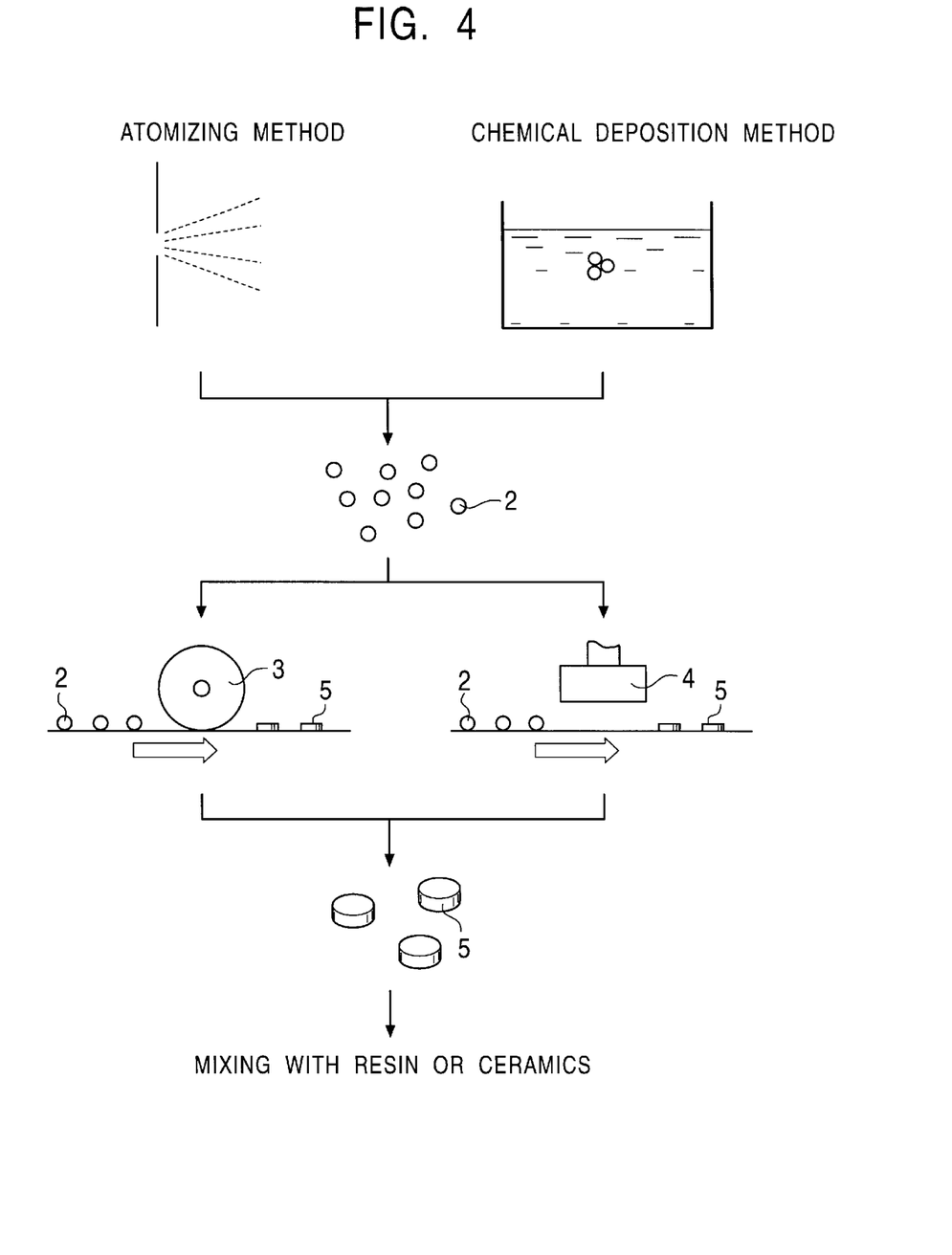
FIG. 4 is a schematic chart showing an exemplary procedure for fabricating a radio wave absorber of the present invention.

FIG. 4 is a schematic chart showing an exemplary process flow for fabricating the disc-shaped magnetic material grain having a high permeability according to an embodiment of the present invention.

The present embodiment relates to the fabricating process employing iron (Fe) as a magnetic material to fabricate a disc-shaped iron-base soft magnetic material. First, a sperical fine grain of iron is prepared by an atomizing method or a chemical deposition method. The atomizing method is a method in which molten metal (iron in this case) is dropwisely supplied or injected through a nozzle into a high-speed flow and allowed to be cooled by the flow, thereby producing the fine grain in the process of such cooling. The grain size can be controlled depending on the preparation conditions such as flow rate of the high-speed flow or supply volume of the molten metal. The chemical deposition method refers to a method in which metal salt of iron is reduced to deposit a fine grain of iron. Again, the grain may be altered depending on the deposition conditions.

A spherical fine grain 2 of pure iron is thus obtained. The diameter of the fine grain 2 may be adjusted from several hundred nanometers to tens of micrometers according to design specifications of a radio wave absorber to be used. Such a fine grain 2 is then flattened by applying physical force using a rolling mill 3, stamp mill 4 or the like, to obtain a flat disc-shaped fine magnetic material grain 5 consisting of a metal (iron).

The fine metal magnetic material grain 5 is then mixed with a resin material or ceramic material to obtain a mixed material, which is used as a radio wave absorber. Such a mixed material is prepared to ensure proper dispersion of the fine metal magnetic material grain 5, to obtain a desirable level of insulating property, and to allow easy handling as a radio wave absorber in a form of paste, sheet or the like.

The resin material may be selected for example from epoxy resin, phenol resin, rubber-base resin and so forth according to the purpose of use or target commodity. The mixed material containing the fine metal magnetic material grain 5 may be fabricated into a paste-type or sheet-type radio wave absorber depending, for example, on the selection of the resin material, preparation conditions therefor and mixing conditions.

Mixing with the ceramic material will provide the mixed material with a stable shape, in which the fine magnetic material grain 5 is stably retained due to the shape preserving property of the rigid ceramic. Such a mixed material, containing the ceramic, may preliminarily be fabricated into a form and dimension of a practical radio wave absorber, and can directly be attached to a place of use.

Figure 5:
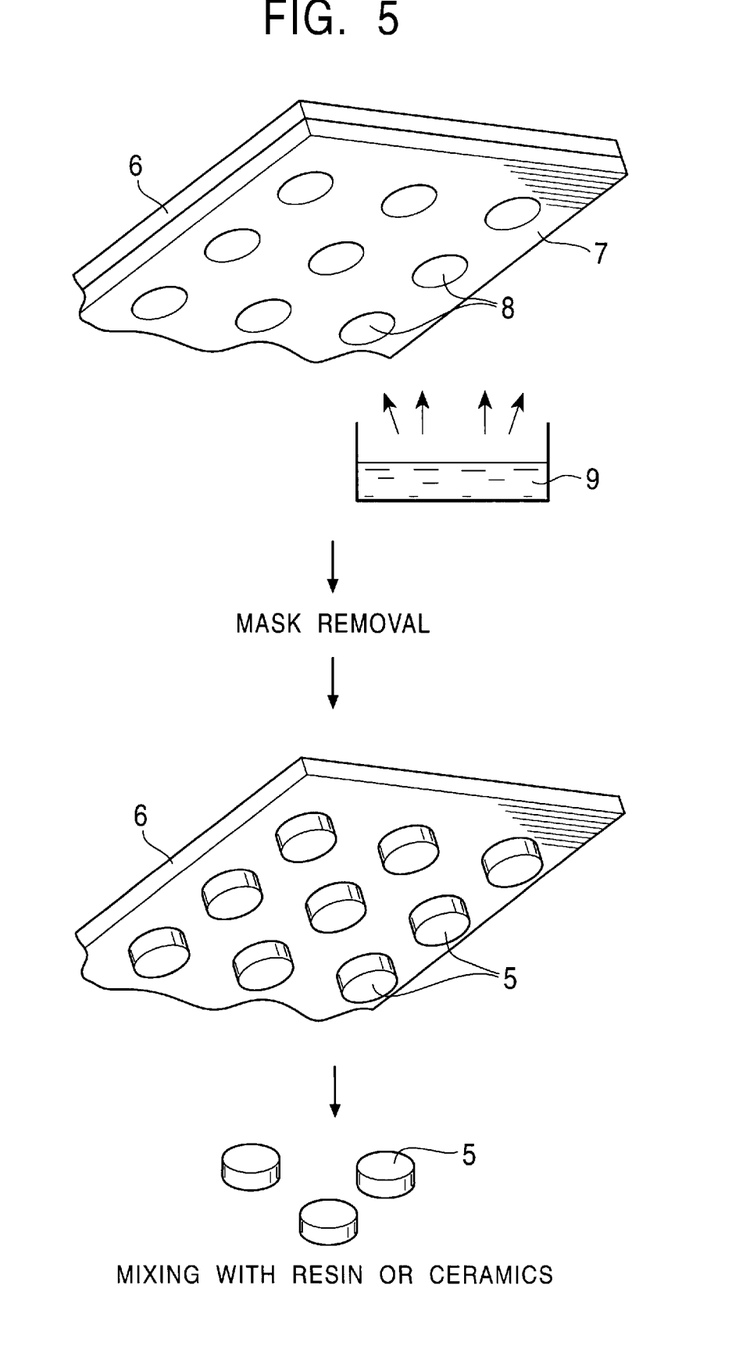
FIG. 5 is a schematic chart showing another exemplary procedure for fabricating the radio wave absorber of the present invention.

FIG. 5 is a schematic chart showing an exemplary procedure for fabricating the disc-shaped magnetic material grain having a high permeability according to another embodiment of the present invention.

The embodiment relates to a fabrication process employing iron (Fe) as a magnetic material for fabricating a disc-shaped iron-base soft magnetic material. The disc-shaped magnetic material grain is obtained by depositing a film on a base film 6 through a mask 7 typically by sputtering, vapor deposition or CVD (chemical vapor deposition). An Fe-base magnetic material, for example, is available as a target. FIG. 5 shows an example of vapor deposition, in which molten metal is vaporized from a deposition source 9 comprising an Fe-base magnetic material, and vaporized metal particle travel through a number of holes 8 formed on the mask 7 to reach the base film 6 and deposits thereon.

The mask 7 is removed and a circular film of metal magnetic material remains deposited on the base film 6. The magnetic material is then separated from the base film 6 to obtain a disc-shaped fine metal magnetic material grain 5. The disc-shaped fine metal magnetic material grain 5 is then mixed with a resin material or ceramic material as described in the foregoing embodiment to obtain a radio wave absorber.

The obtained disc-shaped metal magnetic material grain has a frequency-dependent characteristic of permeability such that, as shown in FIG. 3, the frequency limit shifts to a higher frequency range and a high permeability is retained in a higher frequency range as compared with the conventional hexagonal ferrite.

This is because the pure iron exhibits a saturation magnetization of 2.2 T, whereas that of the spinel ferrite is only as small as about 0.5 T. This means that the pure iron has a permeability approx 4 times larger than that of the spinel ferrite when compared at the same frequency, which in other words means that the pure iron has a frequency limit approx. 4 time higher than that of the spinel ferrite when compared at the same permeability.

In a general expression, the energy absorbing property of a radio wave absorber is given using an imaginary part $\mu''$ of permeability $\mu$ as the following equation (4):

$$P = \frac{1}{2}\omega\mu_0\mu_r''|H|^2 \quad (4)$$

where, P is the radio wave absorption energy, ω is the angular frequency and H is the magnetic field intensity.

Since the disc-shaped metal soft magnetic material grain according to the present invention has a high permeability, it naturally has a high $\mu''$. Thus the radio wave absorption energy P given by the equation (4) will have a large value, which allows for a radio wave absorber with an excellent absorption characteristic.

Beside the foregoing pure iron, examples of available metal soft magnetic material are listed in the following Table 1.

TABLE 1

| Name of Material | Major component elements | Saturation magnetization (T) |
| --- | --- | --- |
| Iron nitride | Fe, N | 2.8 |
| Permendur | Fe, Co | 2.4 |
| Pure Iron | Fe | 2.2 |
| Silicon steel | Fe, Si | 2.0 |
| Cobalt | Co | 1.7 |
| Permalloy | Fe, Ni | 1.0 |
| Nickel | Ni | 0.6 |
| Sendust | Fe, Al, Si | 0.5 |

While not being included in the Table 1, any soft magnetic metal material containing at least a ferromagnetic element selected from Fe, Co and Ni may also be available. It is also allowable to use a Heusler alloy, like an MnAl alloy, which exhibits ferromagnetism in spite of the absence of ferromagnetic elements.

FIGS. 6A to 6E show exemplary modes for applying the radio wave absorber of the present invention.

Figure 6A:
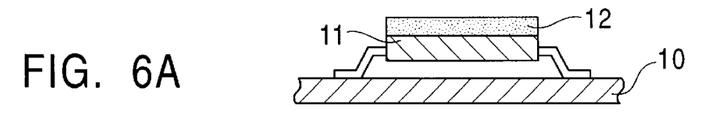
FIGS. 6A to 6E are schematic views showing exemplary modes for applying the radio wave absorber of the present invention.

FIG. 6A shows an IC component 11 mounted on a printed board 10, an upper surface of the IC component 11 being attached with a sheet-type radio wave absorber 12 cut into a shape conforming thereto.

Figure 6B:
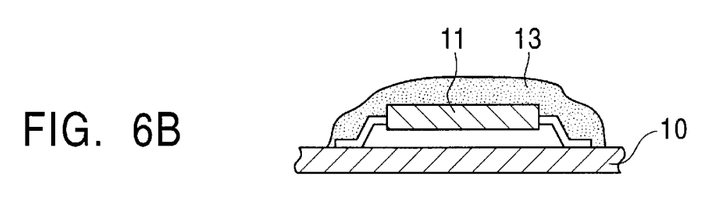

FIG. 6B shows the IC component 11 mounted on the printed board 10, the IC component 11 being covered with a paste-type radio wave absorber 13 coated thereon.

Figure 6C:
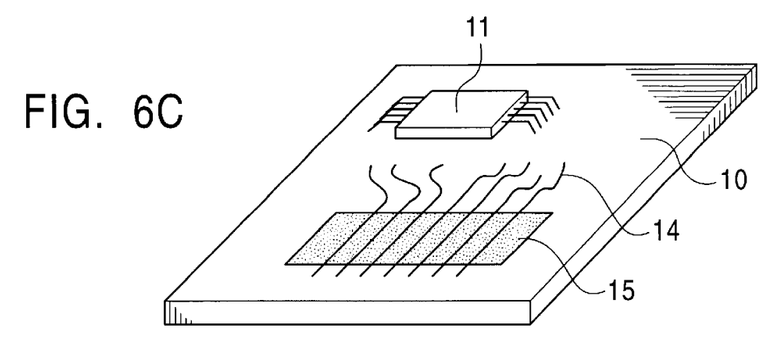

FIG. 6C shows a wiring pattern 14 fabricated on the printed board 10 and is covered with a sheet-type or paste-type radio wave absorber 15.

Figure 6D:
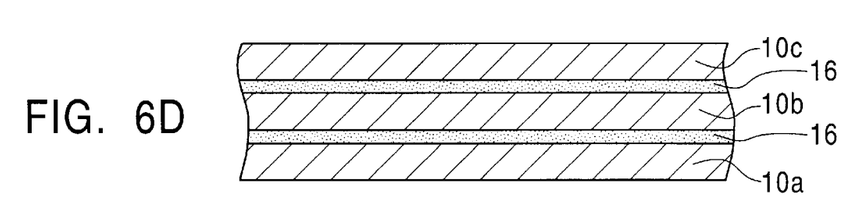

FIG. 6D shows a multi-layered printed board in which component substrates 10a, 10b and 10c are stacked and adhered with a radio wave absorber 16 of the present invention, which functions as an adhesive. Such a radio wave absorber 16 can be obtained by mixing the disc-shape metal magnetic material grain with a tacky resin.

Figure 6E:
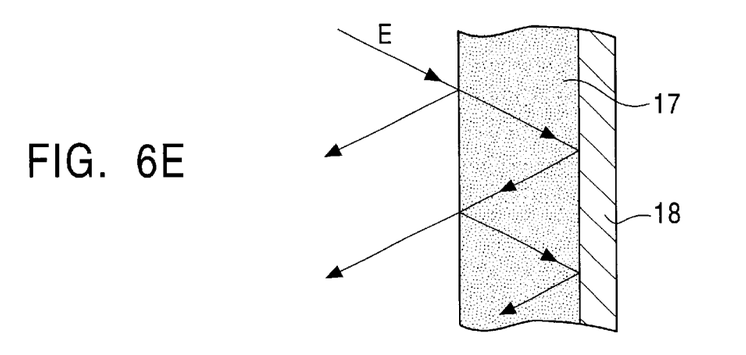

FIG. 6E shows an example of a radio wave absorber 17 of the present invention on an outer surface of a target commodity so as to absorb leakage radio waves emitted from the inside thereof and further providing a radio wave-reflecting metal plate 18 so as to cover the outer surface of the radio wave absorber 17. Radio wave coming from the inside and going outward as indicated by an arrow E will partially be absorbed by the radio wave absorber 17 and non-absorbed portion of the radio wave will be reflected by the radio wave reflecting plate 18 and will be returned back to the radio wave absorber 17 to be absorbed again. Such a combination with the radio wave reflecting plate 18 can allow effective absorption of the leakage radio wave and can suppress influences to the outside. The target commodity to which the radio wave absorber of the present invention may be applied to absorb the leakage electric current includes IC components; miscellaneous electronics devices; a television set; a radar; a satellite; wireless communication devices such as a telephone; and buildings accommodating such electronics devices or communication devices.

In cases where the frequency to be absorbed is known based on the frequency-dependent characteristic of the permeability or permittivity, the radio wave absorber may be designed so as to ensure impedance matching with regard to a planar radio wave by properly selecting a thickness of the radio wave absorber 17 according to the desired frequency. This allows for more effective radio wave absorption by making use of the interference between the incoming radio wave and reflected radio wave, or between reflected radio waves. Thus it is made possible to effectively prevent radio wave failure at buildings that accommodate communication facilities.

In the above-described modes of use or embodiments, the radio wave absorbing material of the present invention may also be provided in a form of a lattice, thereby ensuring the radio wave absorbing property in a wider frequency range. It is also permissible to use a plurality of radio wave absorbing materials differing in radio wave characteristics in a stacked manner so as to compose, efficiently, a radio wave absorber with an improved radio wave absorbing ability over a wider frequency range.

Figure 7:
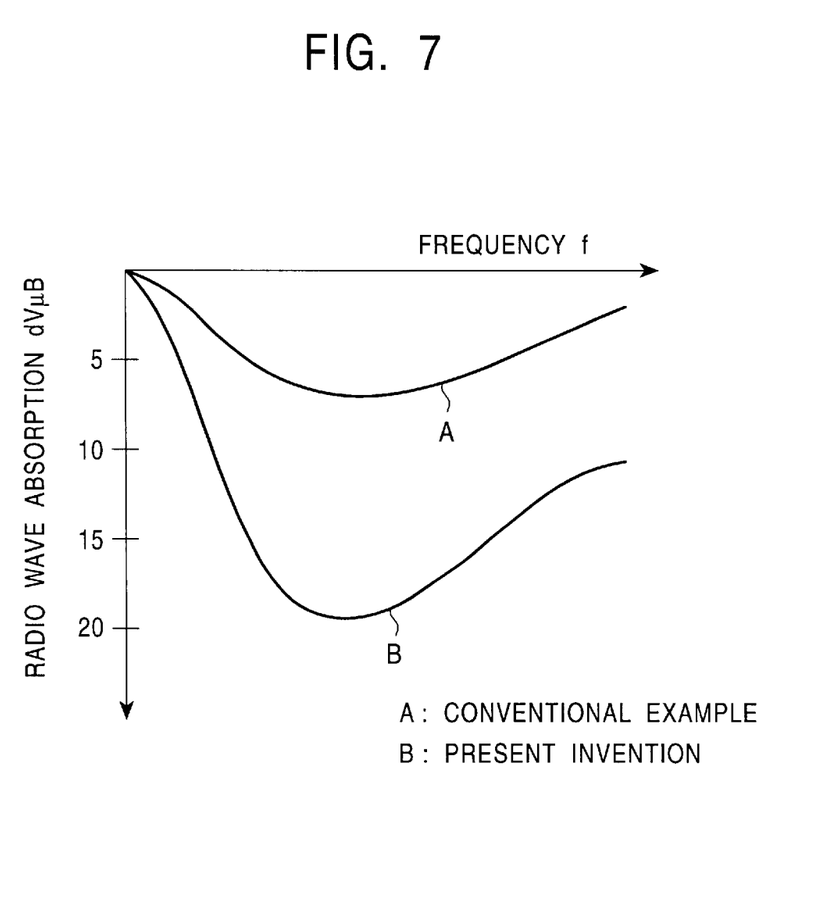
FIG. 7 is a graph showing an effect of the present invention.

FIG. 7 is a graph showing an effect of the present invention. As is clear from the figure, the radio wave absorber of the present invention using the disc-shaped metal magnetic material grain is improved in the amount of radio wave absorption by approx. 4 times as compared with that of the conventional radio wave absorber.

What is claimed is:

1. A radio wave absorber including a mixed material comprising a magnetic material grain and an insulating material, wherein said magnetic material grain is in the shape of a disc.

2. The radio wave absorber of claim 1 further including a reflecting wave plate disposed outside the mixed material such that radio waves that propagate from a source and through the mixed material are reflected by the reflecting wave plate.

3. The radio wave absorber of claim 1 wherein the insulating material includes a ceramic material.

4. The radio wave absorber of claim 1 wherein the insulating material includes a resin material.

5. The radio wave absorber of claim 4 wherein the resin material comprises any one of an epoxy resin, a phenol resin, and a rubber-base resin.

6. The radio wave absorber of claim 3 and 4 wherein the magnetic material grain includes a soft magnetic metal.

7. The radio wave absorber of claim 6 wherein the magnetic material grain includes a ferromagnetic element selected from the group consisting of Fe, Co, and Ni.

8. The radio wave absorber of claim 6 wherein the magnetic material grain includes a Heusler alloy.

9. The radio wave absorber of claim 6 wherein said mixed material is produced as a paste.

10. The radio wave absorber of claim 6, wherein said mixed material is produced as a sheet.

11. The radio wave absorber of claim 1 wherein the magnetic moment of the magnetic material grain is oriented substantially in-plane.

12. The radio wave absorber of claim 11 wherein the disc has an aspect ratio of at least 10.

13. The radio wave absorber of claim 1 wherein the mixed material has a radio wave absorption characteristic greater than 10 dV$\mu$B.

14. The radio wave absorber of claim 1 wherein the mixed material has a resonant frequency greater than a resonant frequency of a hexagonal ferrite.

15. The radio wave absorber of claim 14 wherein the mixed material has a resonant frequency greater than 5 GHz.

16. The radio wave absorber of claim 1 wherein the mixed material has a frequency limit greater than a frequency limit of a hexagonal ferrite.

17. The radio wave absorber of claim 16 wherein the mixed material has a frequency limit greater than 5 GHz.

18. The radio wave absorber of claim 1 wherein the mixed material has a complex permeability greater than a complex permeability of a hexagonal ferrite.

19. The radio wave absorber of claim 1 wherein the absorber is capable of absorbing radio waves at a frequency of 10 GHz.

20. A radio wave absorber including a mixed material comprising a magnetic material grain and an insulating material, wherein said magnetic material grain is in the shape of a solid disc.

21. A radio wave absorber including a mixed material comprising a magnetic material grain and an insulating material, wherein said magnetic material grain is a solid disc having magnetic material throughout.

* * * * *